United States Patent
Tang et al.

(10) Patent No.: US 8,324,019 B2
(45) Date of Patent: Dec. 4, 2012

(54) SOLUTION FOR PACKAGE CROSSTALK MINIMIZATION

(75) Inventors: George C. Tang, Cupertino, CA (US); Lizhi Zhong, Sunnyvale, CA (US); Freeman Y. Zhong, San Ramon, CA (US); Wenyi Jin, Santa Clara, CA (US); Jeffrey A. Hall, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 749 days.

(21) Appl. No.: 12/469,985

(22) Filed: May 21, 2009
(Under 37 CFR 1.47)

(65) Prior Publication Data
US 2009/0289348 A1    Nov. 26, 2009

Related U.S. Application Data

(60) Provisional application No. 61/055,505, filed on May 23, 2008.

(51) Int. Cl.
*H01L 21/00* (2006.01)
(52) U.S. Cl. .......... 438/106; 438/107; 438/108
(58) Field of Classification Search .......... 438/106, 438/107, 108
See application file for complete search history.

(56) References Cited

U.S. PATENT DOCUMENTS

| | | | |
|---|---|---|---|
| 5,895,230 A * | 4/1999 | Bartley | 438/4 |
| 6,343,030 B1 | 1/2002 | Higuchi et al. | 365/52 |
| 6,639,310 B2 | 10/2003 | Takikawa et al. | 257/690 |
| 7,322,855 B2 | 1/2008 | Mongold et al. | 439/608 |

FOREIGN PATENT DOCUMENTS
WO   WO 03/021725 A1   3/2003

OTHER PUBLICATIONS

"Hitachi Microcomputer Technical Update", Nov. 8, 2001, pp. 1-14.
"High Speed Connectors Product Line Information", Tyco Electronics, http://catalog.tycoelectronics.com/catalog/finf/en/c/12177/10431/653?RQS, May 22, 2008, pp. 1-2.

* cited by examiner

*Primary Examiner* — Jae Lee
(74) *Attorney, Agent, or Firm* — Christopher P. Maiorana, PC

(57) ABSTRACT

A method of minimizing crosstalk in an IC package including (A) routing a first signal between first pads and a first trace layer in an congested area, (B) routing the first signal between the first and second trace layers in an non-congested area, (C) routing the first signal between the second trace layer and first pins in the non-congested area, (D) routing a second signal between second pads and the first trace layer in the congested area, (E) routing the second signal between the first and the second trace layers in the congested area and (F) routing the second signal between the second trace layer and second pins in the non-congested area, wherein (i) all of the first and second pins are arranged along a line and (ii) the first pins are offset from the second pins by a gap of at least two inter-pin spaces.

20 Claims, 11 Drawing Sheets

US 8,324,019 B2

SOLUTION FOR PACKAGE CROSSTALK MINIMIZATION

This application claims the benefit of U.S. Provisional Application No. 61/055,505, filed May 23, 2008 and is hereby incorporated by reference in its entirety.

FIELD OF THE INVENTION

The present invention relates to integrated circuit package designs generally and, more particularly, to a method and/or an apparatus implementing a solution for package crosstalk minimization.

BACKGROUND OF THE INVENTION

Conventional integrated circuit packages that support high frequency communications usually have signal crosstalk in the range of 4 percent to 10 percent of the aggressor amplitude. The crosstalk can introduce data errors in both a near-end receiving channel and a far-end receiving channel.

A common technique used to overcome such crosstalk noise is to improve a signal-to-noise ratio. The signal-to-noise ratio is typically increased by increasing transmitted signal amplitudes. However, the increased signal amplitudes can result in high power consumption at the transmitters and higher crosstalk to the victims signals.

SUMMARY OF THE INVENTION

The present invention concerns a method of minimizing crosstalk in a package of an integrated circuit. The method generally comprises the steps of (A) routing a first signal of a first full-duplex channel between two or more first pads of a plurality of external pads and a first trace layer within said package in an congested area of the package, wherein (i) the external pads are disposed on an integrated circuit side of the package and (ii) the first trace layer is proximate the integrated circuit side, (B) routing the first signal between the first trace layer and a second trace layer within the package in an non-congested area of the package, wherein (i) the second trace layer is proximate a pin side of the package and (ii) the pin side is opposite the integrated circuit side, (C) routing the first signal between the second trace layer and two or more first pins of a plurality of external pins in the non-congested area, wherein the external pins are disposed on the pin side of the package, (D) routing a second signal of the first full-duplex channel between two or more second pads of the external pads and the first trace layer in the congested area of the package, (E) routing the second signal between the first trace layer and the second trace layer in the congested area of the package and (F) routing the second signal between the second trace layer and two or more second pins of the external pins in the non-congested area, wherein (i) all of the first pins and the second pins are arranged along a first line in a first direction and (ii) the first pins are offset from the second pins by a gap in the first direction of at least two inter-pin spaces.

The objects, features and advantages of the present invention include providing a solution for package crosstalk minimization that may (i) reduce crosstalk without increasing power, (ii) enable long transmission distances, (iii) provide a low power solution to communication problems and/or (iv) provide a cost efficient solution to the communication problems.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
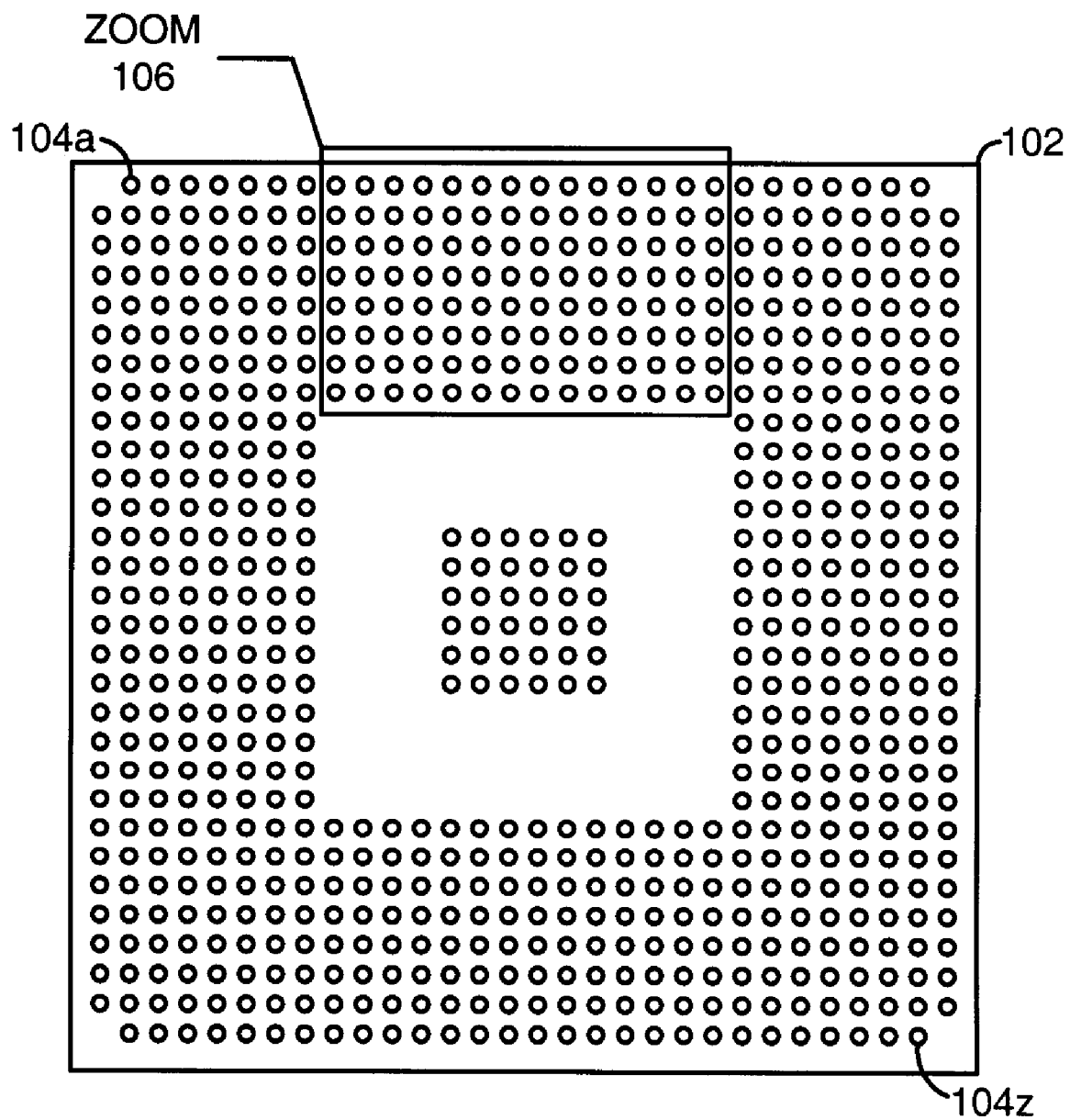
FIG. 1 is a diagram of an example bottom view of an apparatus.

Referring to FIG. 1, a diagram of an example bottom view of an apparatus 100 implementing the present invention is shown. The apparatus (or multi-chip module) 100 may be implemented as a ball grid array (BGA) or a pin array. Hereafter, the term "pin" may refer to balls, pins, tabs and other connection structures used to interface the apparatus 100 to a circuit board. The apparatus 100 generally comprises a package 102 and a large number of pins 104a-104z. The present invention may provide specific package pin assignments and/or routing layer assignments within the package 100 that generally allow crosstalk reduction from a transmission channel to a receive channel to be reduced from the conventional 4 to 10 percent down to approximately 1 percent. The present invention may be applicable (i) between the package 102 and one or more integrated circuits (or chips or dies) mounted on the package 102, (ii) between the package 102 and a circuit board to which the package is mounted and/or (iii) at an interface between any two devices. A zoomed-in region 106 may be described in more detail relating to FIG. 2.

Figure 2:
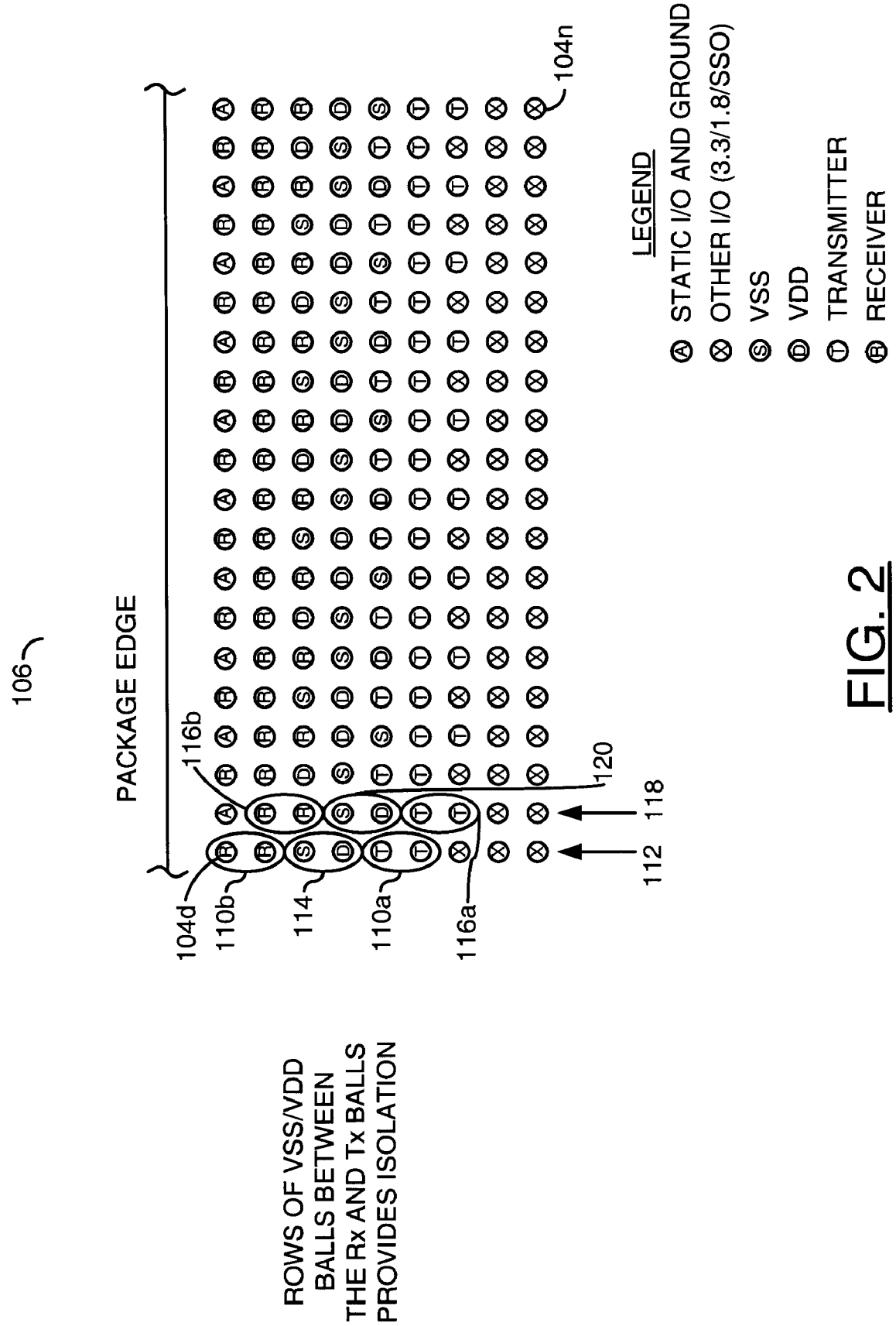
FIG. 2 is a diagram of a first example signal arrangement in a zoom region of the apparatus in accordance with a preferred embodiment of the present invention.

Referring to FIG. 2, a diagram of a first example signal arrangement in the zoom region 106 of the apparatus 100 is shown in accordance with a preferred embodiment of the present invention. The region 106 may include the pins 104d-104n. The pins 104d-104n assigned to static input/output (I/O) signals and/or ground signals may be represented by a letter "A" in a circle. For other I/O signals, the pins 104d-104n may be represented by a letter "X" in a circle. The pins 104d-104n assigned to a first power voltage (e.g., VSS) may be represented by a letter "S" and those assigned to a second power voltage (e.g., VDD) may be represented by a letter "D". High frequency transmitter (or transmit) signals may be represented in the pins 104d-104n by a letter "T" in a circle. High frequency receiver (or received) signals may be represented by a letter "R" in a circle.

Each of the high frequency transmitter signals may be assigned to two of the pins 104d-104n. Consider a group (or pair) of pins, generally represented by a reference number 110a. The group 110a may define a single high frequency communication channel. A pin pair in the group 110a may carry a strong (e.g., ~1200 mV) differential transmitter signal. A first pin and a second pin of the group 110a may be directly adjacent to each other and aligned either along a vertical line (e.g., line 112 as shown) or along a horizontal line.

Each of the high frequency receiver signals may also be assigned to two of the pins 104d-104n. Consider a group of pins, generally represented by a reference number 110b. The group 110b may define a single high frequency communication channel. The pin pair in the group 110b may carry a weak (e.g., ~100 mV) differential receiver signal. A first pin and a second pin of the group 110b may be directly adjacent to each other and aligned along the same line 112 as the corresponding first transmitter signal. The first transmitter signal in group 110a may combine with the first receiver signal in group 110b to form a full-duplex channel.

The group 110a and the group 110b may be separated along the line 112 by two or more of the pins 104d-104n (e.g., three or more inter-pin spaces). The separation is generally illustrated by a group of pins 114. The pins of group 114 may be directly adjacent to each other and aligned along the line 112. The pins of the group 114 may be allocated to the power voltage VDD and/or the power voltage VSS to provide crosstalk isolation between the first transmitter signal of group 110a and the first receiver signal of group 110b.

A second high frequency transmitter signal may be allocated to the pins 104d-104n next to the first transmitter signal. Likewise a second high frequency receiver signal may be allocated to the pins 104d-104n next to the first receiver signal. The second transmitter signal and the second receiver signal may be represented by respective groups 116a and 116b and aligned along a line 118. The line 118 generally runs parallel to the line 112. A gap 120 of two or more of the pins 104d-104n (e.g., three or more inter-pin spaces) may exist between the group 116a and 116b. The pins of the group 120 may be allocated to the power voltage VDD and/or the power voltage VSS to provide crosstalk isolation between the second transmitter signal and the second receiver signal.

Furthermore, the group 116a may be staggered in the vertical direction (e.g., the direction of lines 112 and 118) by one or more inter-pin spaces from the group 110a. The staggering generally provides crosstalk isolation between the first transmitter signal and the second transmitter signal. In a similar fashion, the group 116b may be offset in the vertical direction by one or more inter-pin spaces from the group 110b. The offset generally provides crosstalk isolation between the first receiver signal and the second receiver signal. Furthermore, low edge-rate signals, generally immune to high frequency crosstalk, may be placed on the pins directly adjacent to the transmitter signals.

Figure 3:
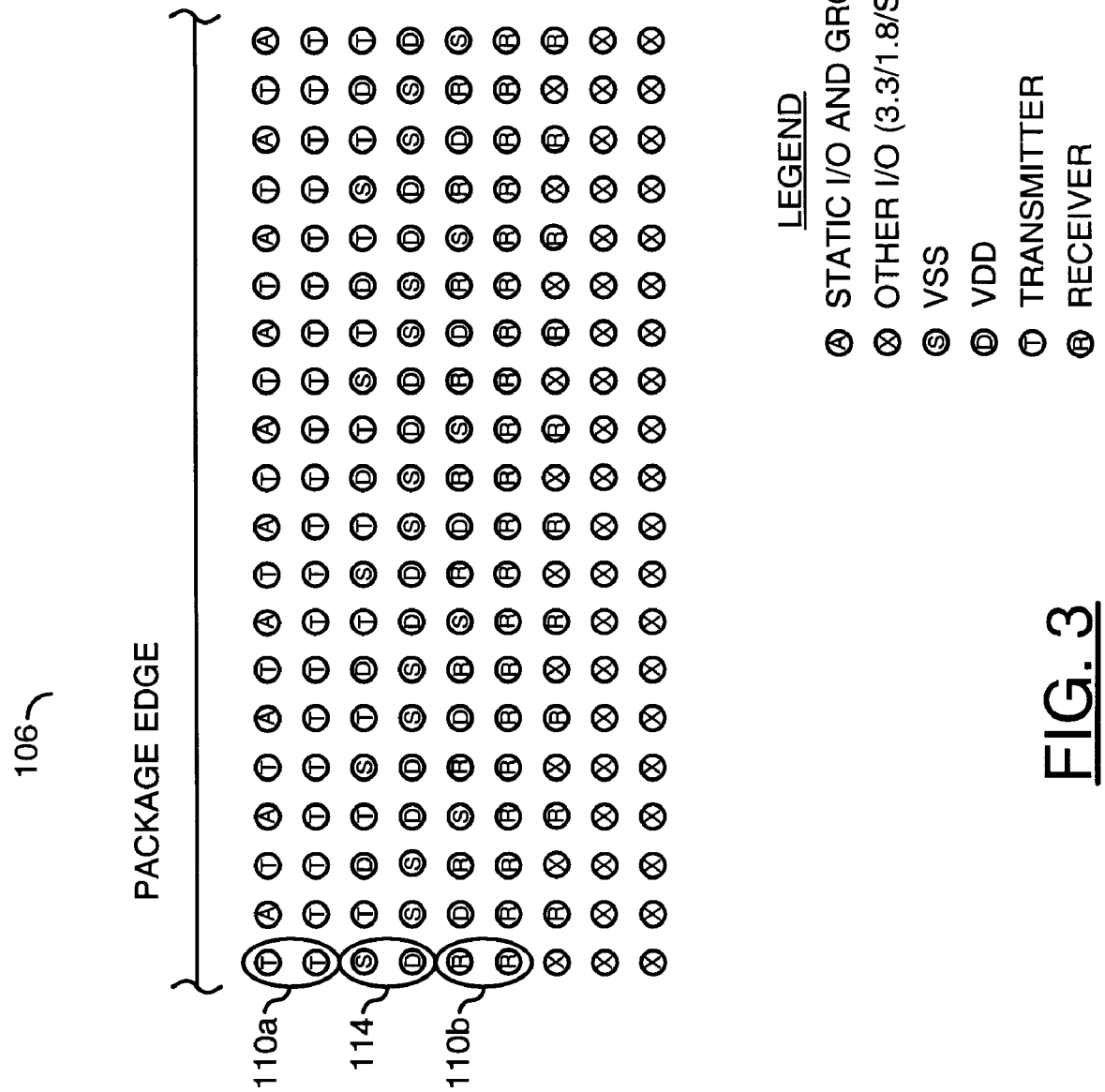
FIG. 3 is a diagram of a second example signal arrangement in the zoom region.

Referring to FIG. 3, a diagram of a second example signal arrangement in the zoom region 106 is shown. In the second example implementation, the positioning of the transmitter groups (e.g., group 110a) and the receiver groups (e.g., group 110b) may be reversed. The transmitter groups may be positioned near the outer edge of the package and the receiver groups may be positioned closer to the center of the package. The transmitter groups and receiver groups may be isolated and/or shielded from each other by the other pins (e.g., group 114) along a particular direction (e.g., columns or rows). Neighboring transmitter groups may be staggered relative to each other in directly adjacent columns or rows. Likewise, neighboring receiver groups may be staggered relative to each other in directly adjacent columns or rows.

Figure 4:
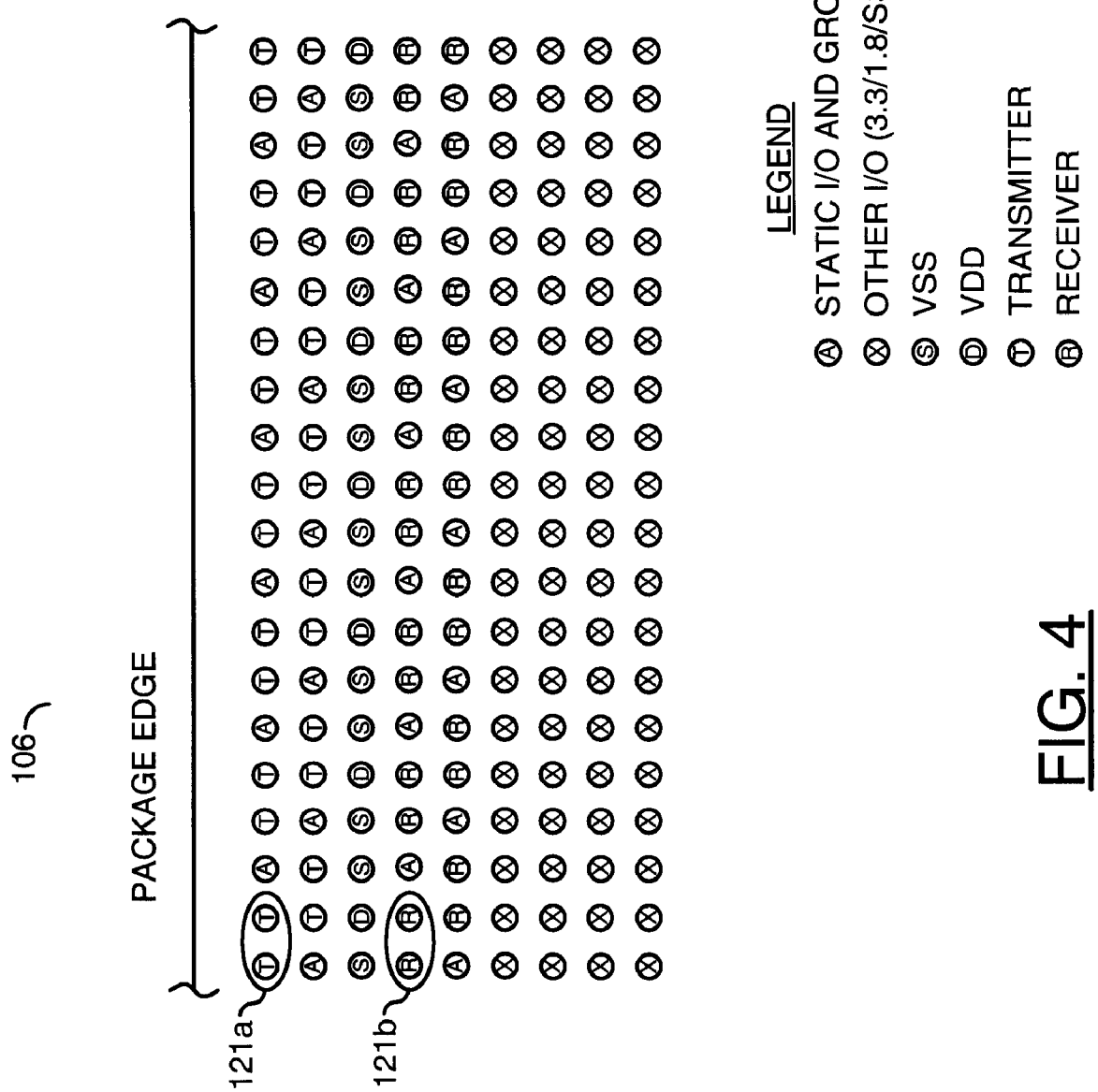
FIG. 4 is a diagram of a third example signal arrangement in the zoom region.

Referring to FIG. 4, a diagram of a third example signal arrangement in the zoom region 106 is shown. The third example implementation is similar to the second example implementation with a few exceptions. In the third example implementation, the transmission pin pairs and the receive pin pairs may be arranged in rows (or columns) running parallel to the edge of the package 102. An example of such pin pairs is generally illustrated as a transmitter group 121a and an associated receiver group 121b. Furthermore, the transmitter pin pairs may be allocated to one or a few rows directly adjacent to the package edge while the receiver pin pairs may be alloced to one or more rows separated/isolated from the transmitter pin pairs.

Figure 5:
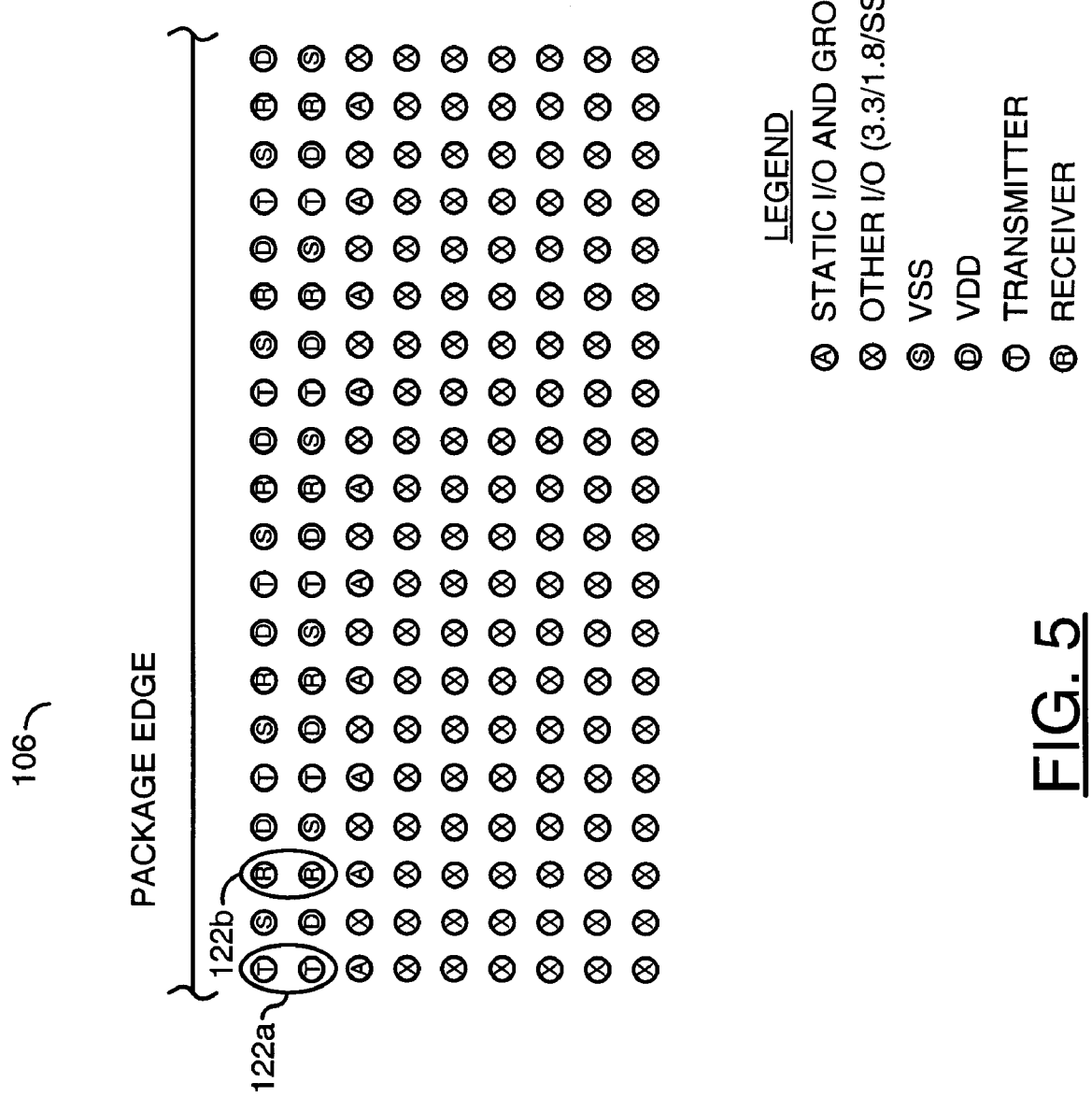
FIG. 5 is a diagram of a fourth example signal arrangement in the zoom region.

Referring to FIG. 5, a diagram of a fourth example signal arrangement in the zoom region 106 is shown. In the fourth example embodiment, the transmitter groups and the receiver groups may be positioned at a similar distance from the package edge. For example, a particular transmitter group 122a may be positioned adjacent the package edge in a given column (or row) of pins. A corresponding receiver group 122b may also be adjacent to the package edge, but in a different column (or row) of pins. One or more intermediate columns (or rows) of pins may separate the transmitter group 122a from the receiver group 122b.

Figure 6:
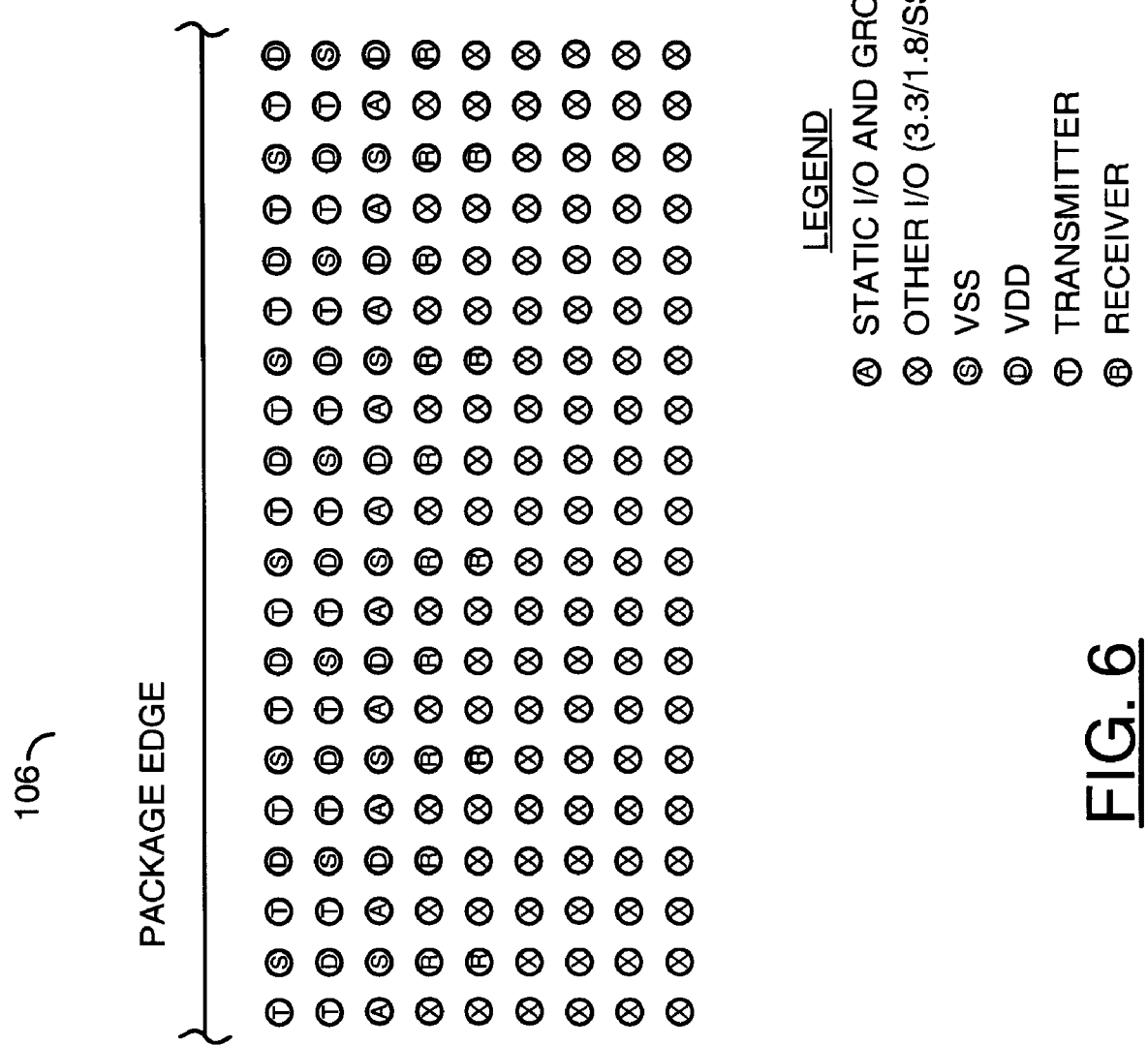
FIG. 6 is a diagram of a fifth example signal arrangement in the zoom region.

Referring to FIG. 6, a diagram of a fifth example signal arrangement in the zoom region 106 is shown. Isolation and/or shielding may be provided between the various transmitter groups and the receiver groups in multiple directions. For example, the transmitter groups may be positioned on odd numbered columns (or rows) while the receiver groups are positioned on even numbered columns (or rows). Furthermore, the transmitter group in a given channel may be separated from the receiver group in the given channel by one or more rows (or columns) of pins.

Figure 7:
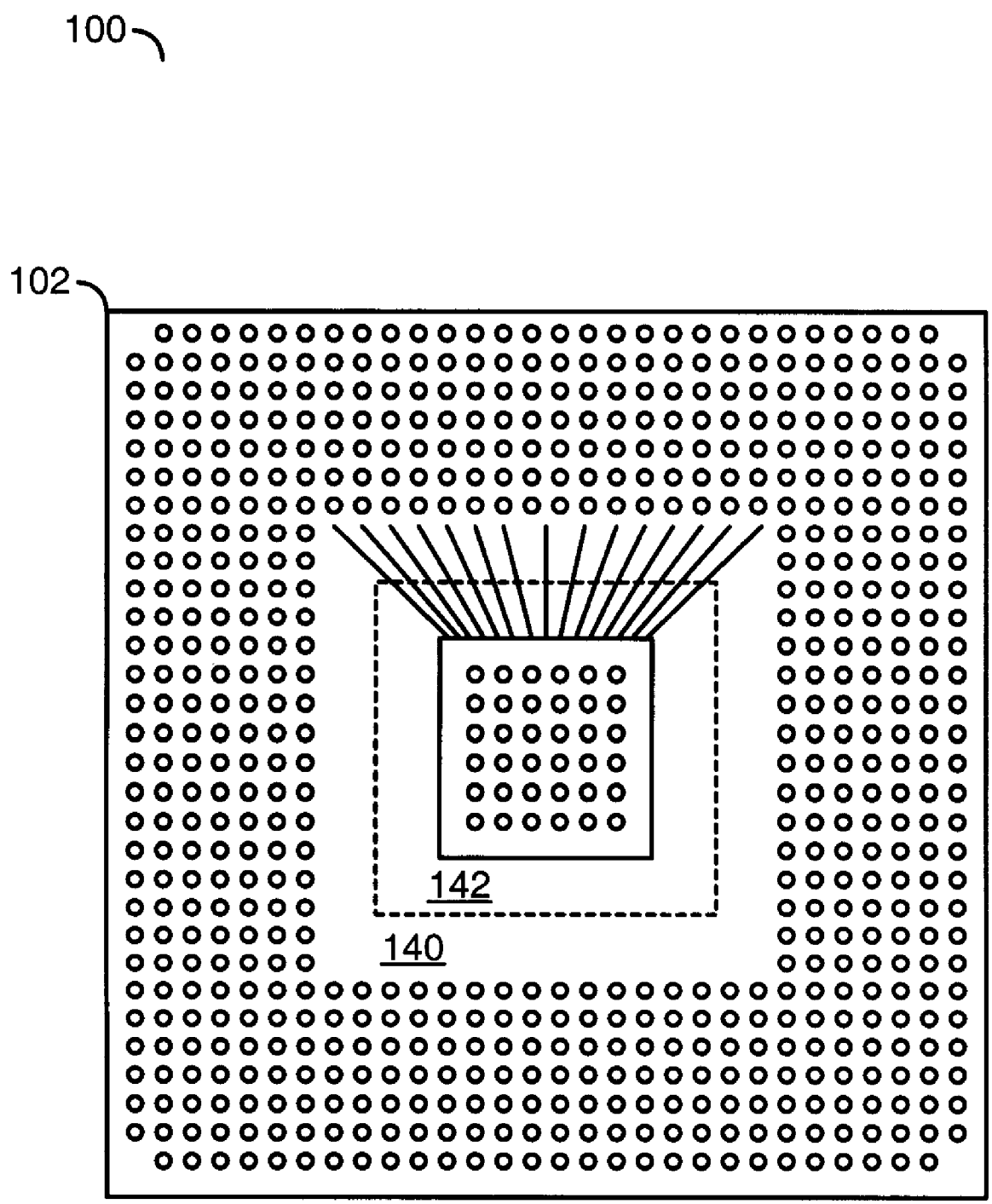
FIG. 7 is a diagram of another example bottom view of the apparatus.

Referring to FIG. 7, a diagram of another example bottom view of the apparatus 100 is shown. The pins 104a-104z located proximate an outer edge of the package 102 may be considered in a non-congested area of the package 102. For example, the pins in a region 140 (e.g., between the dotted box and the outside edge of the package) may be viewed as non-congested pins. The pins 104a-104z located near a center of the package 102 may be considered in a congested area of the package 102. For example, the pins in the region 142 (e.g., inside the dotted box) may be viewed as congested pins.

Figure 8:
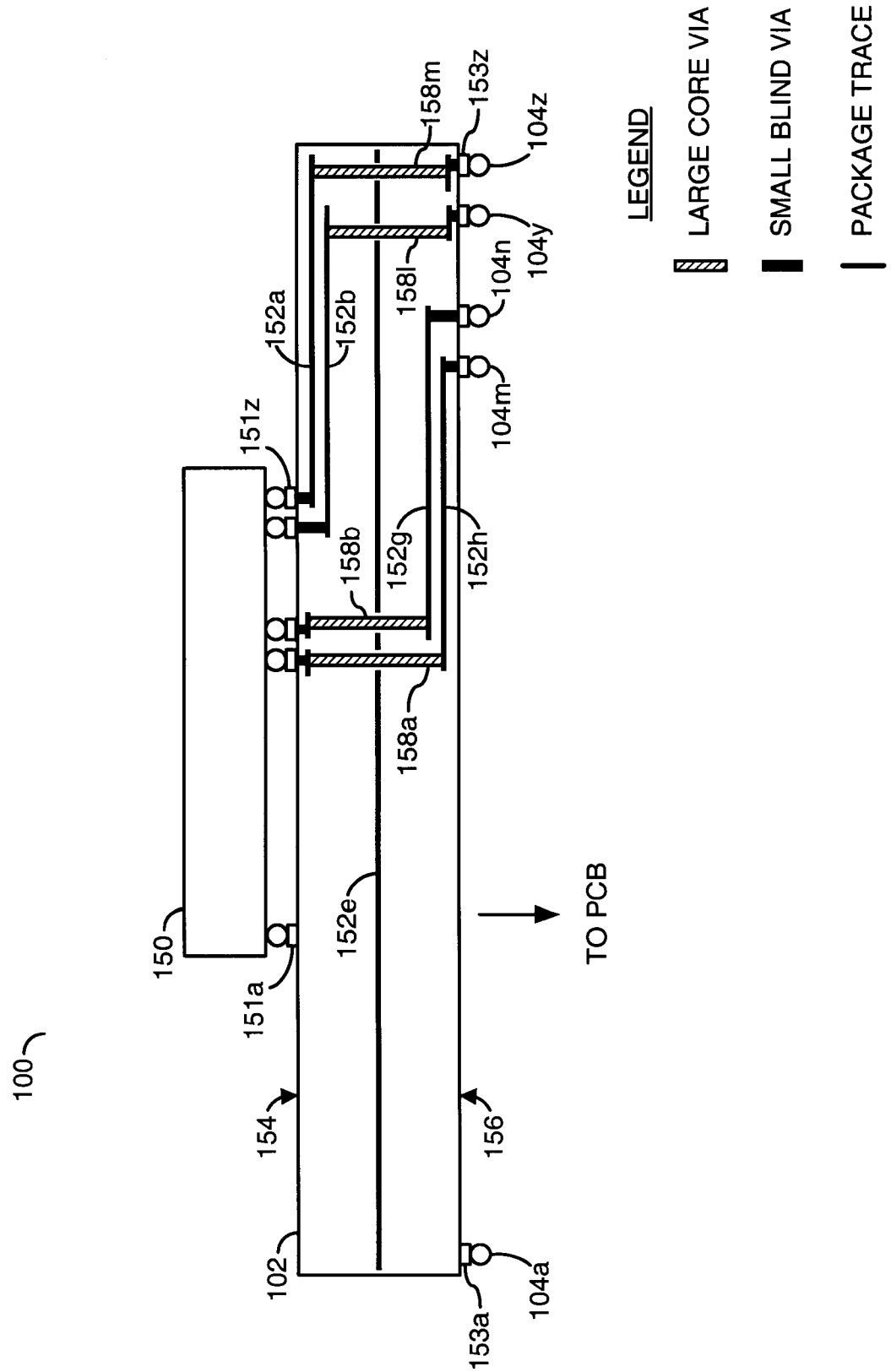
FIG. 8 is a diagram of an example horizontal cross-sectional view of a package with an integrated circuit.

Referring to FIG. 8, a diagram of an example horizontal cross-sectional view of the package 102 with an integrated circuit 150 is shown. The package 102 may include multiple internal trace layers 152a-152h between an integrated circuit side (e.g., top side) 154 and a pin side (e.g., bottom side) 156 of the package 102. Multiple bonding pads 151a-151z may be formed on the integrated circuit side 154 of the package to connect to the integrated circuit 150. The connections may be achieved through solder balls, wire bonds, tabs or the like. Pin pads 153a-153z may be formed on the pin side 156 of the package 102 to support the pins 104a-104z. Several vias 158a-158m may be created within the package 102 to (i) connect the bonding pads 151a-151z to the trace layers 152a-152h, (ii) form inter-trace connections and (iii) connect the trace layers 152a-152h to the pin pads 153a-153z.

Each of the vias 158a-158m is generally formed as either a large core via or a small blind via. Large core vias may be established where signals and power cross between the upper trace layers (e.g., 152a-152b) and the lower trace layers (e.g., 152g-152h). Large core vias generally extend most of the way through the package 102. Small blind vias may be established where signals and power cross between (i) the bonding pads 151a-151z and the top trace layer 152a, (ii) two or a few of the upper trace layers, (iii) two or a few of the lower trace layers and (iv) the bottom trace layer 152h and the pads 153a-153z. The small blind vias are generally considered blind vias that span short vertical distances in the package 102. As such, each signal may route between a bonding pad (e.g., 151a) and a pin pad (e.g., 153a) using (i) one or more small blind vias between the bonding pad and one or more upper traces, (ii) a large core via between the upper traces and the lower traces and (iii) one or more small blind vias between one or more lower traces and the pin pad. The small blind vias and the large core vias generally have significantly different parasitic capacitance values, with the small blind vias having less parasitic capacitance than the large core vias.

The trace layers 152a-152h may carry signals and power horizontally through the package 102 between the pads 151a-151z and the pads 153a-153z. In some embodiments, the high frequency receiver signal pins may be located at outer rows of the package 102 in or near non-congested areas. Primary routing of the receiver signals horizontally may be accomplished in a single or a few trace layers (e.g., 152a and 152b) near the integrated circuit side 154 of the package 102. Transfer of the receiver signals from the traces to the pads 151a-151z may occur proximate the center of the package 102 in or near congested areas.

Small blind vias may be used to route the receiver signals vertically near the integrated circuit 150. The small blind vias generally have small parasitic capacitances in congested areas. Furthermore, the use of small blind vias in the congested areas may help in implementing power planes (e.g., trace layer 152e) in the congested areas. Generally, the power planes should not be significantly cut away in the congested area to make room for the vias due to current carrying criteria. Large core vias may be used to route the receiver signals vertically in the non-congested areas where the power planes are more readily cut away to minimize parasitics.

Placement of the receiver signals along the outer edges, through the upper trace layers and through the appropriate vias may create the following benefits: minimize impedance mismatches due to trace crowding, minimize crosstalk induced in the receiver signals by other signals in narrow vertical routing channels, minimize pin and/or via crosstalk induced in the receiver signals by other signals with VDD and/or VSS pins acting as shields and/or reduced electromagnetic interference due to trace imbalances (e.g., skew, impedance and common mode noise mode conversion).

In some embodiments, the high frequency transmitter signals may be located at inner rows of the package 102 in or near congested areas. Primary routing of the transmitter signals horizontally may be accomplished in a single or a few trace layers (e.g., 152g and 152h) near the pin side 156 of the package 102. Reception of the transmitter signals from the integrated circuit 150 to the traces may occur proximate the center of the package 102 in or near congested areas.

The transmitter signals are generally strong signals that are better at driving the larger parasitic capacitances of the large core vias in the congested area. Noise coupling (e.g., inductive or capacitive) through the vias and/or the traces may occur at high frequencies and high frequency noises are generally attenuated at a higher rate than the transmitted signals as the transmitted signals propagate. Therefore, generating strong transmitter signals generally results in better noise immunity (e.g., higher signal-to-noise ratios).

Placement of the transmitter signals away from the outer edges, through the lower trace layers of the package 102 and through the appropriate vias may create the following benefits: minimize signal skew, minimize crosstalk that the transmitter signals induce in other signals (e.g., the receiver signals) in narrow vertical routing channels, minimize pin and/or via crosstalk that the transmitter signals induce in other signals with VDD and/or VSS pins acting as shields and/or reduced electromagnetic interference (e.g., skew, impedance and common mode noise voltages). In a manner similar to the trace layers 152a-152h of the package 102, all of the signals may be routed on internal layers of a printed circuit board (PCB).

Figure 9:
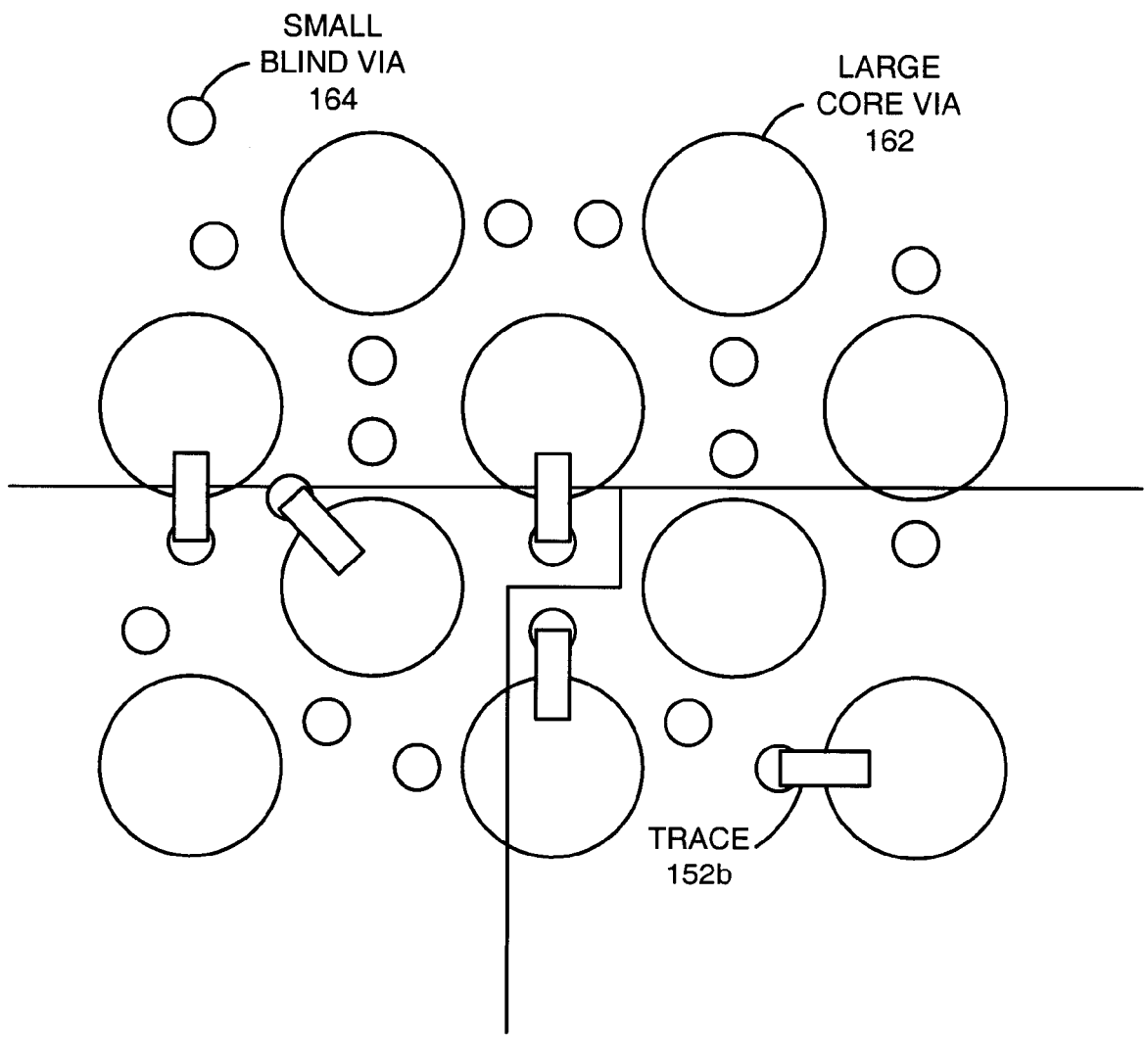
FIG. 9 is a diagram of an example set of vias in the package.

Referring to FIG. 9, a diagram of an example set 160 of vias in the package 102 is shown. The set 160 generally comprises large core vias 162 and small blind vias 164. A relative size of the large core vias 162 compared with the small blind vias 164 is illustrated by the diagram. Other relative sizes of the vias may be implemented to meet the criteria of a particular application.

Figure 10:
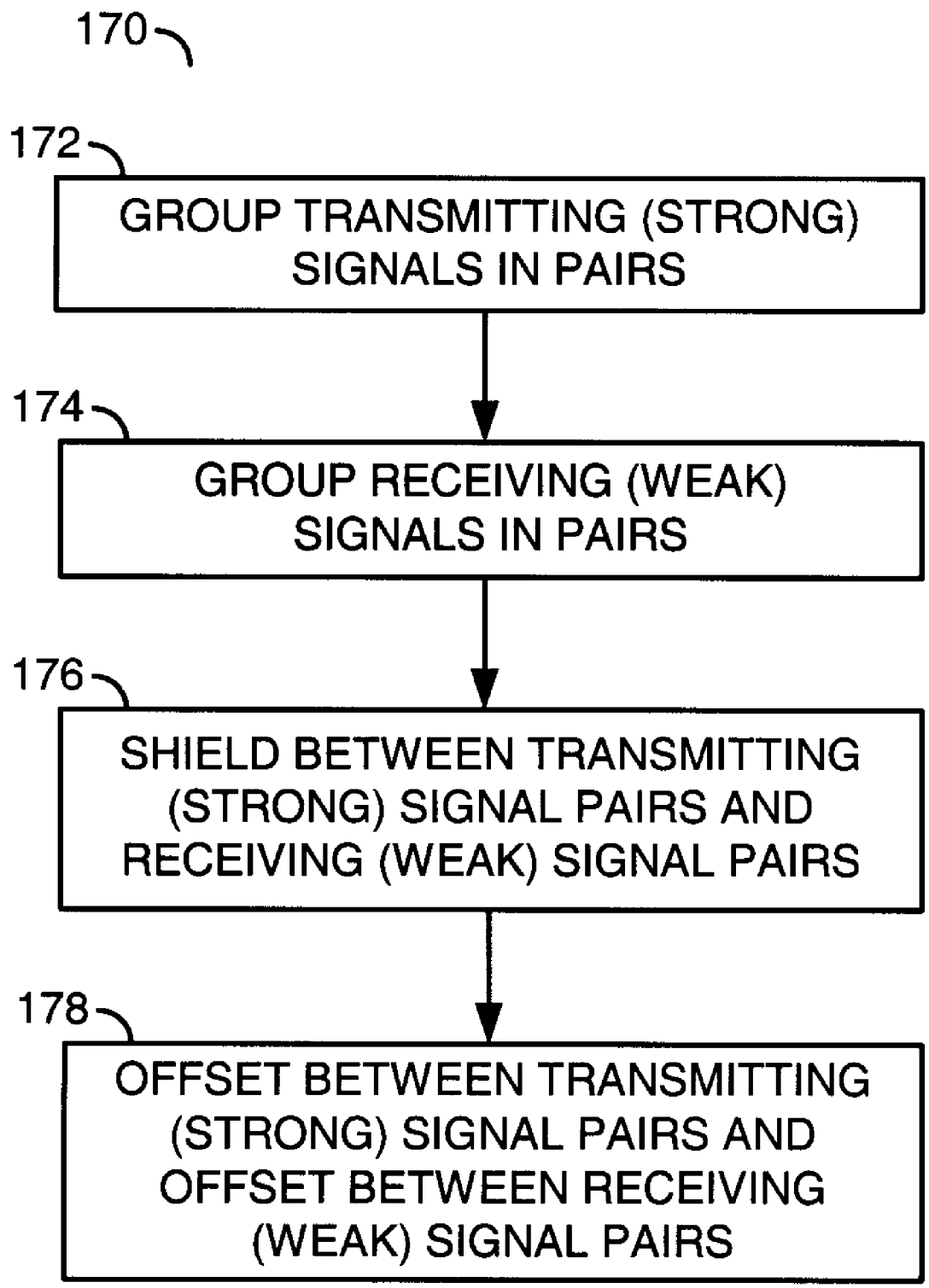
FIG. 10 is a general flow diagram of an example method of minimizing crosstalk in the package.

Referring to FIG. 10, a general flow diagram of an example method 170 of minimizing crosstalk in a package of an integrated circuit is shown. The method (or process) 170 may be implemented by the package 100 as shown in FIGS. 1-9. The method 170 generally a step (or block) 172, a step (or block) 174, a step (or block) 176 and a step (or block) 178. The method 170 may be applied to each of (i) the pin pad assignments, (ii) the trace routing and (ii) the bonding pad assignments.

In the step 172, the strong transmitting signals may be grouped together. The relatively weaker receiving signals may be grouped together in the step 174. In the step 176, shielding in the form of physical separation and/or other intermediate signal pins (e.g., see examples in FIGS. 2-6) may be located between the transmitting signals and the receiving signals of the various signal groups. Neighboring transmitting groups and neighboring receiving groups may be offset (staggered) from each other in the step 178 (e.g., see examples in FIGS. 2-6).

Figure 11:
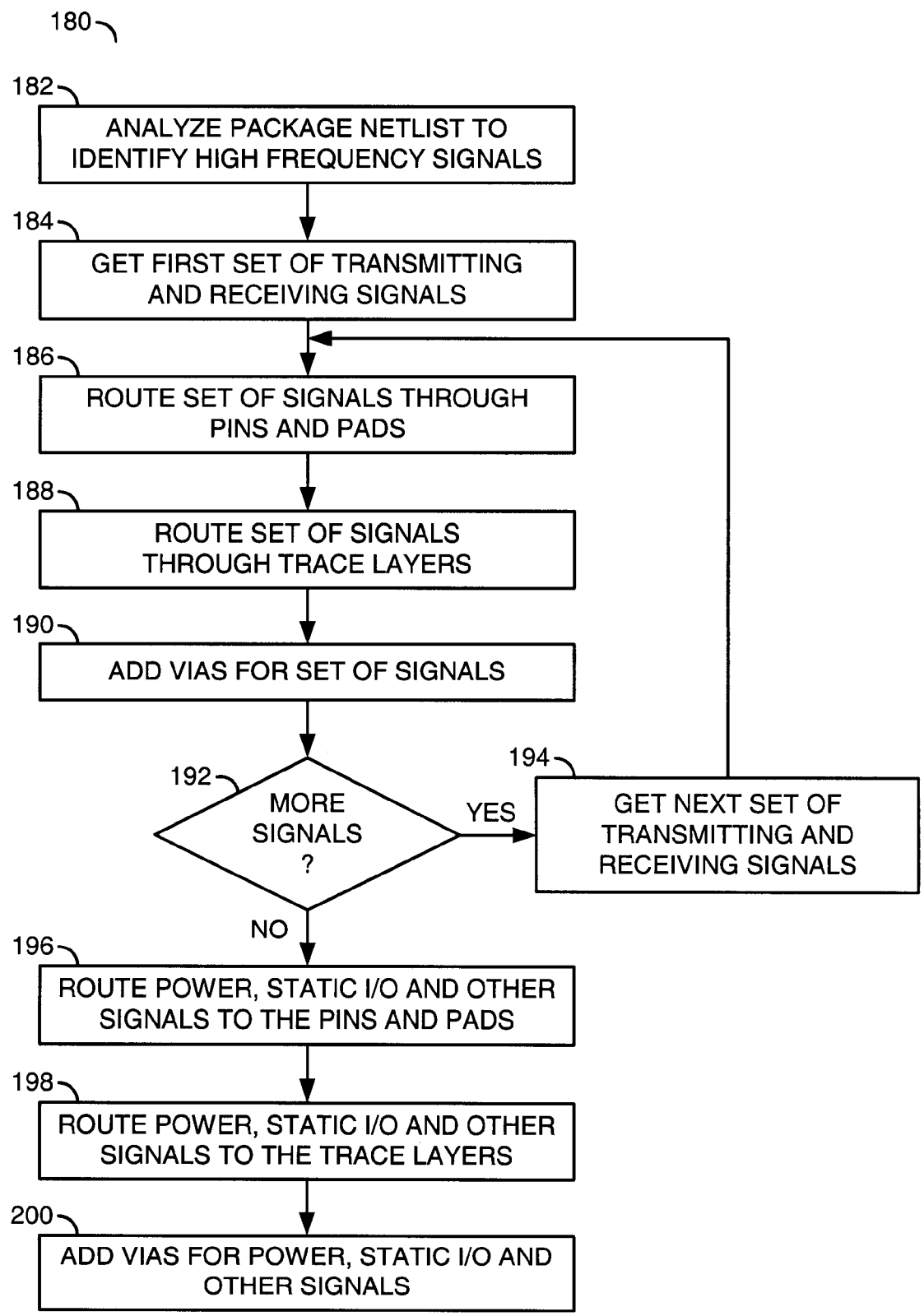
FIG. 11 is a detailed flow diagram of an example method of minimizing crosstalk.

Referring to FIG. 11, a detailed flow diagram of an example method 180 of minimizing crosstalk is shown. The method (or process) 180 may also be implemented by the package 100 as shown in FIGS. 1-9. The method 180 generally comprises a step (or block) 182, a step (or block) 184, a step (or block) 186, a step (or block) 188, a step (or block) 190, a step (or block) 192, a step (or block) 194, a step (or block) 196, a step (or block) 198 and a step (or block) 200. The method 180 may be applied to each of (i) the pin pad assignments, (ii) the trace routing and (ii) the bonding pad assignments.

In the step 182, an analysis may be performed of a package netlist to identify the various types of signals passing through the package 102. The signals may include the high frequency transmitter signals and the high frequency receiver signals. A first set comprising a first receiver signal and the corresponding first transmitter signal may be identified in the step 184 for allocation to the pins and trace layers. Routing of the set of signals through the various pins and pads may be conducted in the step 186. In the step 188, an allocation of the set of signals to the various trace layers may be conducted. In the step 190, vias may be added to the package 102 to move the set of signals between (i) the pins and trace layers, (ii) between different trace layers, as appropriate, and (iii) between the trace layers and pads on the integrated circuit side of the package 102.

Once the first set of signals has been routed, a check may be made for more sets of signals in the step 192. If more sets of signals remain to be placed and routed (e.g., the YES branch of step 192), the method 180 may continue with the step 194. In the step 194, a next set of a high frequency transmitter signal and a corresponding high frequency receive signal may be selected. The method 180 may then continue with the routing of the next set of signals in the steps 186-190. After all of the signal sets have been considered (e.g., the NO branch of step 192), the method 180 may continue with the step 196.

In the step 196, power voltages, static I/O signals and other signals may be allocated to the pins and pads. Allocation of the power voltages, static I/O signals and other signals to the trace layers may be performed in the step 198. Vias may be added for the power voltages, static I/O signals and other signals in the step 200. Although the steps of the method 180 have been shown in an example sequence, one of skill in the art would understand that the sequence may be altered and still achieve the same results. The same package signal routing techniques of the present invention may also be used in PCB designs to maintain the crosstalk isolation in the PCBs.

The functions performed by the diagrams of FIGS. 1-11 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMS, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. A method of minimizing crosstalk in a package of an integrated circuit, comprising the steps of:
   (A) routing a first signal of a first full-duplex channel between two or more first pads of a plurality of external pads and a first trace layer within said package in a congested area of said package, wherein (i) said external pads are disposed on an integrated circuit side of said package and (ii) said first trace layer is proximate said integrated circuit side;
   (B) routing said first signal between said first trace layer and a second trace layer within said package in a non-congested area of said package, wherein (i) said second trace layer is proximate a pin side of said package and (ii) said pin side is opposite said integrated circuit side;
   (C) routing said first signal between said second trace layer and two or more first pins of a plurality of external pins in said non-congested area, wherein said external pins are disposed on said pin side of said package;
   (D) routing a second signal of said first full-duplex channel between two or more second pads of said external pads and said first trace layer in said congested area of said package;
   (E) routing said second signal between said first trace layer and said second trace layer in said congested area of said package; and
   (F) routing said second signal between said second trace layer and two or more second pins of said external pins in said non-congested area, wherein (i) all of said first pins and said second pins are arranged along a first line in a first direction and (ii) said first pins are offset from said second pins by a gap in said first direction of at least two inter-pin spaces.

2. The method according to claim 1, further comprising the step of:
   routing at least one power voltage through at least one power pin of said external pins, wherein said at least one power pin (i) is disposed on said first line in said gap and (ii) shields said first signal from said second signal.

3. The method according to claim 1, further comprising the step of:
   routing at least one power voltage through a third trace layer within said package, wherein said third trace layer (i) is disposed between said first trace layer and said second trace layer and (ii) shields said first signal from said second signal.

4. The method according to claim 1, further comprising the step of:
   routing a third signal of a second full-duplex channel between two or more third pins of said external pins and two or more third pads of said external pads, wherein (i) said third pins are (a) directly adjacent to said first pins in a second direction and (b) staggered by at least one of said inter-pin spaces in said first direction from said first pins and (ii) said second direction is perpendicular to said first direction.

5. The method according to claim 4, further comprising the step of:
   routing a fourth signal of said second full-duplex channel between two or more fourth pins of said external pins and two or more fourth pads of said external pads, wherein (i) all of said third pins and said fourth pins are arranged along a second line in said first direction and (ii) said third pins are offset from said fourth pins by said gap in said first direction.

6. The method according to claim 1, further comprising the steps of:
   routing said first signal through a plurality of first vias between said first pads and said first trace layer in said congested area, wherein each of said first vias has a first diameter; and
   routing said first signal through a plurality of second vias between said first trace layer and said second trace layer in said non-congested area, wherein each of said second vias has a second diameter larger than said first diameter.

7. The method according to claim 6, further comprising the step of:
   routing said first signal through a plurality of third vias between said second trace layer and said first pins in said non-congested area, wherein each of said third vias has said first diameter.

8. The method according to claim 6, further comprising the steps of:
   routing said second signal between said second pads and said first trace layer through said first vias in said congested area; and
   routing said second signal through said second vias between said first trace layer and said second trace layer in said congested area.

9. The method according to claim 8, further comprising the steps of:
   routing said second signal through a plurality of third vias between said second trace layer and said second pins in said non-congested area, wherein each of said third vias has said first diameter.

10. The method according to claim 1, wherein (i) said first signal comprises a differential receive signal routed on two or more first paths between said first pads and said first pins and (ii) said second signal comprises a differential transmit signal routed on two or more second paths between said first pads and said first pins.

11. An apparatus comprising:
- a package having (i) a integrated circuit side, (ii) a pin side opposite said integrated circuit side a (iii) a first trace layer proximate said integrated circuit side and (iv) a second trace layer proximate said pin side;
- a plurality of external pins disposed on said pin side of said package; and
- a plurality of external pads disposed on said integrated circuit side of said package, wherein
  - (i) a first signal of a first full-duplex channel is routed between (a) two or more first pads of said external pads and said first trace layer in a congested area of said package, (b) said first trace layer and said second trace layer in a non-congested area of said package and (c) said second trace layer and two or more first pins of said external pins in said non-congested area,
  - (ii) a second signal of said first full-duplex channel is routed between (a) two or more second pads of the external pads and said first trace layer in said congested area, (b) said first trace layer and said second trace layer in said congested area and (c) said second trace layer and two or more second pins of said external pins in said non-congested area,
  - (iii) all of said first pins and said second pins are arranged along a first line in a first direction, and
  - (iv) said first pins are offset from said second pins by a gap in said first direction of at least two inter-pin spaces.

12. The apparatus according to claim 11, further comprising at least one power pin of said external pins (i) disposed on said first line in said gap and (ii) shielding said first signal from said second signal.

13. The apparatus according to claim 11, further comprises a third trace layer (i) disposed between said first trace layer and said second trace layer and (ii) shielding said first signal from said second signal.

14. The apparatus according to claim 11, further comprising two or more third pins of said external pins and two or more third pads of said external pads routing a third signal of a second full-duplex channel, wherein (i) said third pins are (a) directly adjacent to said first pins in a second direction and (b) staggered by at least one of said inter-pin spaces in said first direction from said first pins and (ii) said second direction is perpendicular to said first direction.

15. The apparatus according to claim 14, further comprising two or more fourth pins of said external pins and two or more fourth pads of said external pads routing a fourth signal of said second full-duplex channel, wherein (i) all of said third pins and said fourth pins are arranged along a second line in said first direction and (ii) said third pins are offset from said fourth pins by said gap in said first direction.

16. The apparatus according to claim 11, further comprising:
- a plurality of first vias routing said first signal between said first pads and said first trace layer in said congested area, wherein each of said first vias has a first diameter; and
- a plurality of second vias routing said first signal between said first trace layer and said second trace layer in said non-congested area, wherein each of said second vias has a second diameter larger than said first diameter.

17. The apparatus according to claim 16, further comprising a plurality of third vias routing said first signal between said second trace layer and said first pins in said non-congested area, wherein each of said third via has said first diameter.

18. The apparatus according to claim 16, wherein (i) said first vias route said second signal between said second pads and said first trace layer in said congested area and (ii) said second vias route said second signal between said first trace layer and said second trace layer in said congested area.

19. The apparatus according to claim 18, further comprising a plurality of third vias routing said second signal between said second trace layer and said second pins in said non-congested area, wherein (i) each of said third vias has said first diameter and (ii) said congested area comprises below said external pads.

20. The apparatus according to claim 11, wherein (i) said first pads are proximate an outer edge of an integrated circuit connected to said external pads and (ii) said second pads are proximate a center of said integrated circuit.

* * * * *